United States Patent
Hung et al.

(10) Patent No.: US 8,258,546 B2
(45) Date of Patent: Sep. 4, 2012

(54) HIGH-K METAL GATE DEVICE

(75) Inventors: Cheng-Lung Hung, Hsinchu County (TW); Yong-Tian Hou, Singapore (SG); Keh-Chiang Ku, Sindan (TW); Chien-Hao Huang, Banciao (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/186,656

(22) Filed: Jul. 20, 2011

(65) Prior Publication Data
US 2011/0272766 A1 Nov. 10, 2011

Related U.S. Application Data

(62) Division of application No. 12/253,741, filed on Oct. 17, 2008, now Pat. No. 7,994,051.

(51) Int. Cl.
*H01L 27/118* (2006.01)

(52) U.S. Cl. ............... 257/204; 257/310; 257/E29.126; 438/528; 438/652

(58) Field of Classification Search .............. 438/528, 438/652; 257/204, 310, E29.126
See application file for complete search history.

(56) References Cited

U.S. PATENT DOCUMENTS

| | | | |
|---|---|---|---|
| 5,440,168 A | 8/1995 | Nishimura et al. | |
| 5,767,004 A | 6/1998 | Balasubramanian et al. | |
| 6,660,660 B2 | 12/2003 | Haukka et al. | |
| 6,720,630 B2 | 4/2004 | Mandelman et al. | |
| 7,018,880 B2 | 3/2006 | Hao et al. | |
| 7,361,591 B2 | 4/2008 | Park | |
| 7,435,657 B2 | 10/2008 | Shin | |
| 7,521,345 B2 | 4/2009 | Park et al. | |
| 7,592,243 B2 * | 9/2009 | Momiyama et al. | 438/528 |
| 7,741,170 B2 | 6/2010 | Hong et al. | |
| 7,947,549 B2 | 5/2011 | Park et al. | |
| 2006/0113547 A1 | 6/2006 | Shin | |
| 2006/0211259 A1 | 9/2006 | Maes et al. | |

FOREIGN PATENT DOCUMENTS

| | | |
|---|---|---|
| CN | 1710718 | 12/2005 |
| CN | 1855545 | 11/2006 |

OTHER PUBLICATIONS

Chinese Patent Office, Office Action mailed Nov. 9, 2010, Application No. 200910134815.8, 5 pages.

* cited by examiner

*Primary Examiner* — Jarrett Stark
*Assistant Examiner* — Nicholas Tobergte
(74) *Attorney, Agent, or Firm* — Haynes and Boone, LLP

(57) ABSTRACT

A semiconductor device includes a semiconductor substrate and a transistor formed in the substrate, the transistor having a gate stack that has an interfacial layer formed on the substrate, a high-k dielectric layer formed over the interfacial layer, a metal layer formed over the high-dielectric layer, a capping layer formed between the interfacial layer and high-k dielectric layer; and a doped layer formed on the metal layer, the doped layer including at least F.

19 Claims, 3 Drawing Sheets

HIGH-K METAL GATE DEVICE

PRIORITY DATA

This application is a divisional of U.S. Ser. No. 12/253,741 filed Oct. 17, 2008, and entitled, "Implantation Method For Reducing Threshold Voltage For High-K Metal Gate Device," the entire disclosures of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. There has been a desire to fabricate these devices with a metal material for the gate electrode and a high-k dielectric for the gate dielectric. However, an n-type MOS device (NMOS) and a p-type MOS device (PMOS) require different work functions for their respective gate electrodes. Several approaches have been implemented to achieve N and P work functions, simultaneously, for the metal gates. However, it has been observed that due to an insufficient effective work function and poor thermal stability of the P-metal the threshold voltage may increase and carrier mobility may degrade in the PMOS device during semiconductor processing.

Accordingly, what is needed is an implantation method for reducing a threshold voltage for a high-k metal gate device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
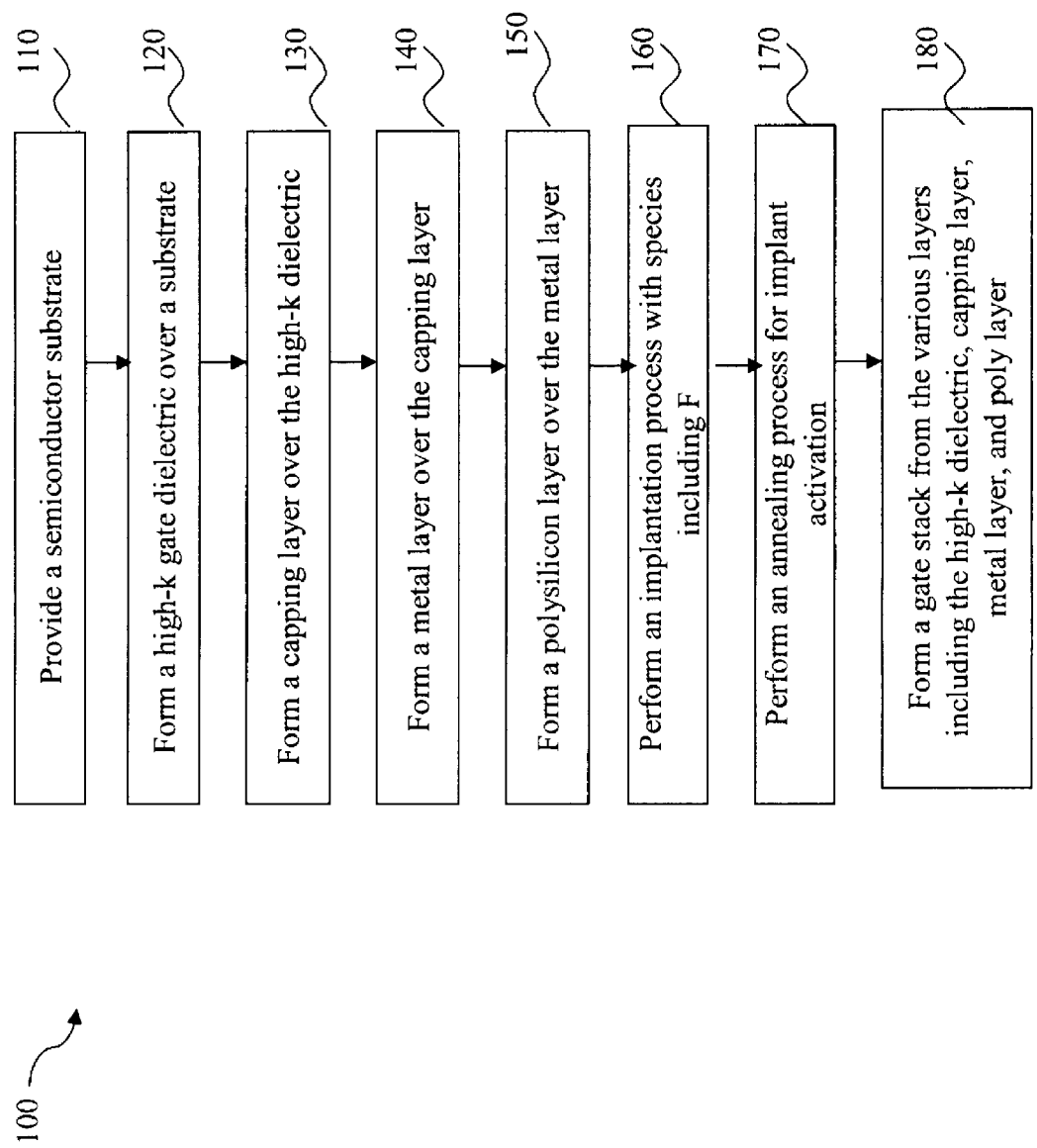
FIG. 1 is a flowchart illustrating a method for fabricating a semiconductor device in a high-k metal gate process according to various aspects of the present disclosure.
Figure 2:
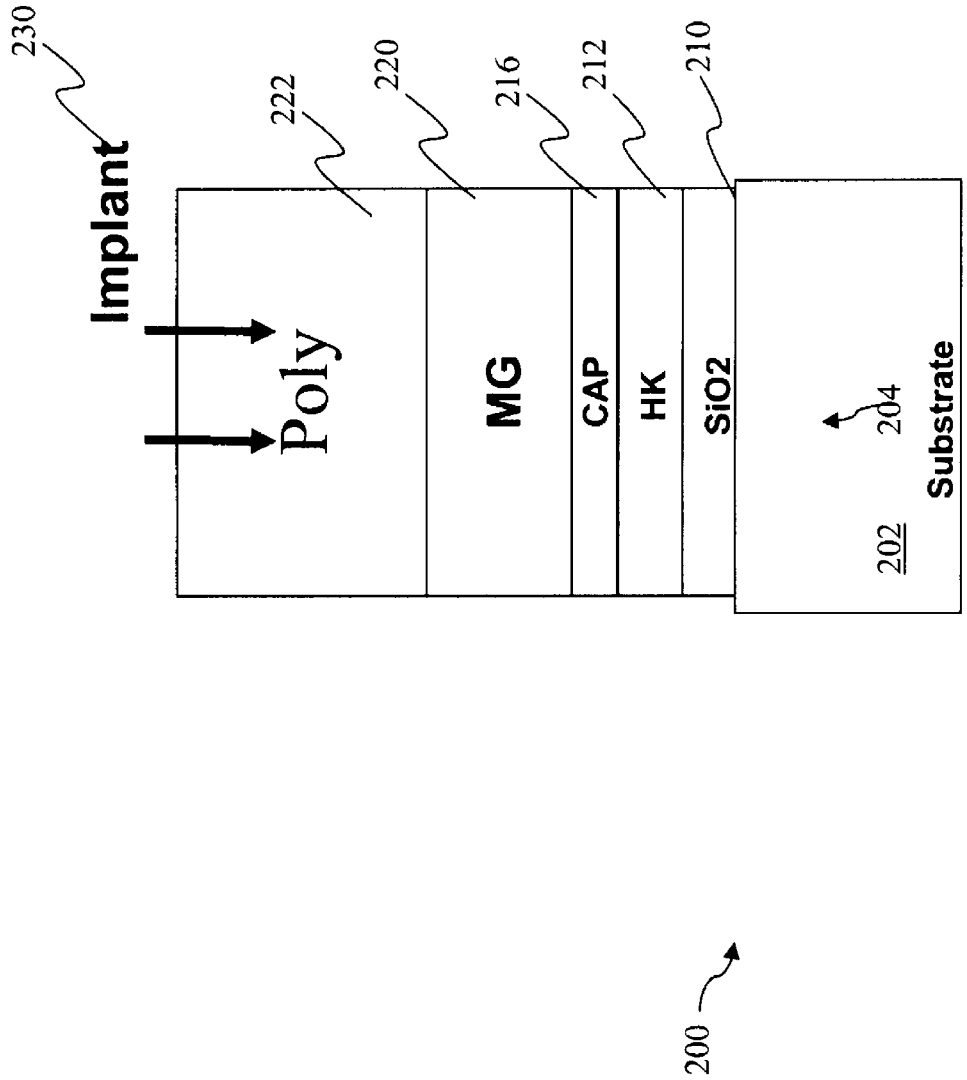
FIG. 2 is a cross-sectional view of a semiconductor device at an intermediate stage of fabrication according to the method of FIG. 1.

Referring to FIG. 1, illustrated is a flowchart of a method 100 for fabricating a semiconductor device having a high-k dielectric and metal gate according to various aspects of the present disclosure. Referring also to FIG. 2, illustrated is cross-sectional view of a semiconductor device 100 at an intermediate stage of fabrication according to the method 100 of FIG. 1. FIG. 2 has been simplified to emphasize a gate structure of a PMOS device for a better understanding of the inventive concepts of the present embodiment. The method 100 may improve the performance of the PMOS device by an implantation process through a poly layer that may shift the flat band voltage towards a P-type work function metal (P-metal).

The method 100 begins with block 110 in which a semiconductor substrate may be provided. The semiconductor device 200 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 may further include an isolation structure (not shown) such as a shallow trench isolation (STI) feature formed in the substrate 202 for isolating active regions and in the substrate. The isolation structure may be formed of silicon oxide, silicon nitride, silicon oxynitride, fluoride-doped silicate (FSG), and/or a low k dielectric material known in the art. It is understood that the active regions may be configured as an NMOS device and as a PMOS device even though only the PMOS device 204 is shown.

The semiconductor device 200 may further include an interfacial layer 210 formed on the substrate 202. The interfacial layer 210 may include a silicon oxide layer having a thickness ranging from about 6 to about 8 angstrom (Å). The interfacial layer 210 may be formed by atomic layer deposition (ALD), chemical vapor deposition (CVD), or other suitable process. The method 100 continues with block 120 in which a high-k dielectric layer may be formed over the substrate. The semiconductor device 200 may further include a high-k dielectric layer 212 formed on the interfacial layer.

The high-k dielectric layer 212 may be formed by ALD, CVD, metal-organic CVD (MOCVD), physical vapor deposition (PVD or sputtering), combination thereof, or other suitable deposition technique. The high-k dielectric layer 212 may include a thickness ranging from about 5 to about 25 angstrom (Å). The high-k dielectric layer 212 may include a hafnium based material such as hafnium oxide (HfO2). Alternatively, the high-k dielectric layer 212 may optionally include other high-k dielectric materials such as HfSiO, HfSiON, HfTaO, HfTaTiO, HfTiO, HfZrO, HfAlON, and combinations thereof.

The method 100 continues with block 130 in which a capping layer may be formed over the high-k dielectric layer. The semiconductor device 200 may further include a capping layer for tuning a work function (for the gate electrode) for properly performing as an NMOS device (not shown) or a PMOS device 204. For example, a capping layer 216 such as aluminum oxide (AlOx) may be formed on the high-k dielectric layer 212 in the PMOS device 208. Alternatively, the capping layer 216 may optionally include AlN, Al or Al with oxidation, or combination thereof. The capping layer 216 may include a thickness ranging from about 2 to about 10 angstrom (Å). The capping layer 216 may be formed by ALD, CVD, MOCVD, PVD, combination thereof, or other suitable deposition technique.

The method 100 continues with block 140 in which a metal layer may be formed over the capping layer. The semiconductor device 100 may further include a metal layer 220 formed over the capping layer 216. The metal layer 220 may include various metals such as TiN, TiAlN, TaN, WN, or other suitable metals. The metal layer 220 may have a thickness ranging from 20 to about 200 angstrom (Å). The metal layer 220 may be formed by various deposition techniques such as CVD, PVD or sputtering, plating, or other suitable deposition technique.

The method 100 continues with block 150 in which a polysilicon layer may be formed over the metal layer. The semiconductor device 200 may further include a polysilicon (or poly) layer formed 222 over the metal layer 220 by a suitable deposition process. The poly layer 222 may include a thickness ranging from about 200 to about 1000 angstrom (Å).

The method 100 continues with block 160 in which an implantation process with a species containing F may be performed on the polysilicon layer. The implantation process 230 may be performed on the polysilicon (poly) layer 222 with a dopant species containing F. For example, the dopant species may include F, BF2, BF, F contained species, or combinations thereof. The implantation process 230 may include the following process parameters: energy ranging from 2 to about 20 KeV (preferably 15 KeV for poly layer thickness of 800) and dose ranging from 1E14 to about 1E16 atoms/cm2 (preferably 1E15 atoms/cm2). Further, the implantation process 230 may include a plasma technique or immersion ion implant technique. It should be noted that during the implantation process 230 on the poly layer 222 in the PMOS device 204, the poly layer in the NMOS device (not shown) may be protected from the implantation process by a patterned photoresist layer. The patterned photoresist layer may be formed by photolithography, immersion photolithography, or other suitable process.

The method 100 continues with block 170 in which an annealing process may be performed for implant activation. Following the implantation process 230, an annealing process may be performed for implant activation. The dopant species containing F may diffuse into the metal gate layer and high-k dielectric/capping layer during the annealing process. The annealing process may include rapid thermal annealing (RTA), furnace annealing, flash lamp annealing (FLA), laser spike annealing (LSA), or combination thereof. The annealing process may include a temperature ranging from 600 to about 1100 degree C. (preferably 1000 degree C.).

The method 100 continues with block 180 in which a gate stack may be formed from the various layers. One exemplary method for patterning the gate structure is described below. A layer of photoresist is formed on the poly layer by a suitable process, such as spin-on coating, and then patterned to form a patterned photoresist feature by a proper lithography patterning method. The pattern of the photoresist layer can then be transferred by a dry or wet etching process to the underlying poly layer 222, metal layer 220, capping layer 216, high-k dielectric layer 212, and interfacial layer 210 in a plurality of processing steps and various proper sequences. The photoresist layer may be stripped thereafter by a suitable process known in the art. In another embodiment, a hard mask layer may be used and formed on the poly layer 222. The patterned photoresist layer is formed on the hard mask layer. The pattern of the photoresist layer is transferred to the hard mask layer and then transferred to the underlying material layers to form the gate structures. The hard mask layer may include silicon nitride, silicon oxynitride, silicon carbide, and/or other suitable dielectric materials, and may be formed using a method such as CVD or PVD. The gate stack in the PMOS device 204 may include an interfacial layer, high-k dielectric layer, capping layer, metal gate layer, and polysilicon layer.

It is understood the semiconductor device 200 may continue with CMOS process flow to form various structures such as lightly doped drain regions (LDD), sidewall spacers on the gate stacks, source/drain regions (including SiGe features), silicide features, contact/vias, interconnect layers, metal layers, interlayer dielectric, passivation layer and so forth. For example, light doped source/drain regions may be formed in the substrate by an ion implantation process and may be aligned (self aligned) with the gate stacks. The lightly doped drain regions of a P-type (P-type dopant such as boron) may be formed on either side of the gate stack in the PMOS device as in known in the art. The lightly doped drain regions of an N-type (N-type dopant such as phosphorous or arsenic) may be formed on either side of the gate stack in the NMOS device as is known in the art. In another example, sidewall or gate spacers may then be formed on both sidewalls of the gate stack of the PMOS and NMOS devices, respectively. The sidewall spacers may include a dielectric material such as silicon oxide. Alternatively, the sidewall spacers may optionally include silicon nitride, silicon carbide, silicon oxynitride, or combinations thereof. In some embodiments, the sidewall spacers may have a multilayer structure. The sidewall spacers may be formed by a deposition and etching (anisotropic etching technique) as is known in the art.

It should be noted that by implanting a species containing F through the poly layer 222 the flat band voltage of the gate structure may be shifted toward a P work function metal (P-metal). That is, the effective work function of the PMOS device 204 may be adjusted by the implantation process. Accordingly, the threshold voltage Vt in the PMOS device 204 may be reduced and the carrier mobility may be improved, and thus improving device performance and reliability. Although the example above describes the implantation process 230 being performed after deposition of the poly layer 222 and prior to gate patterning or etching, it is understood that the implantation process 230 may alternatively be performed after gate pattering or etching.

Figure 3:
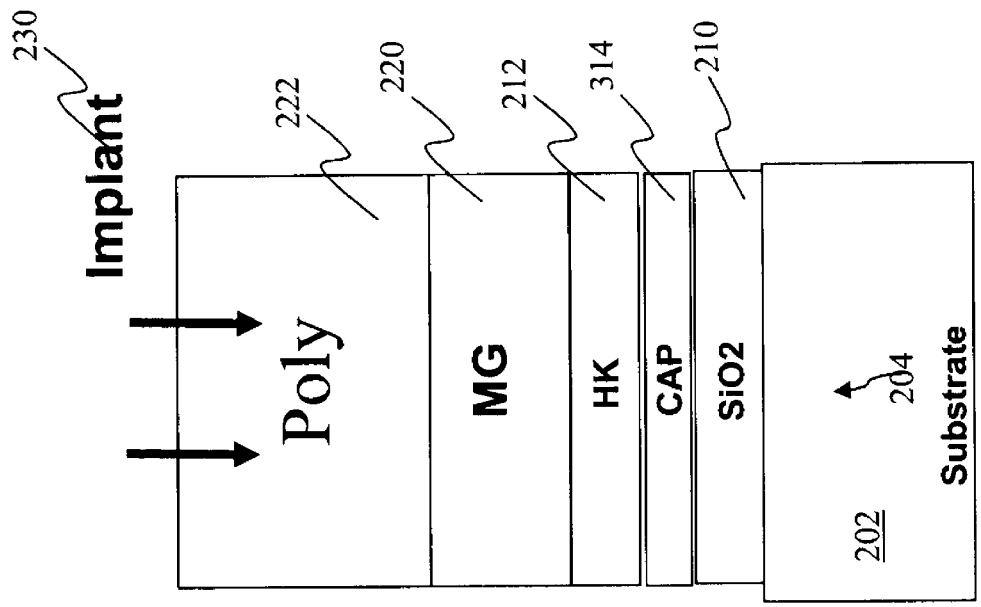
FIG. 3 is a cross sectional view of an alternative semiconductor device having a high-k metal gate according to various aspects of the present disclosure.

Referring to FIG. 3, illustrated is a cross-sectional view of an alternative semiconductor device 300 having a high-k dielectric and metal gate according to various aspects of the present disclosure. The semiconductor device 300 is similar to the semiconductor device 200 of FIG. 2 except for the configuration of a capping layer. Similar features in FIGS. 2 and 3 are numbered the same for the sake of simplicity and clarity. The semiconductor device 300 may include a capping layer 314 that may be formed between the interfacial layer 210 and high-k dielectric layer 212 rather than between the high-k dielectric layer 212 and metal layer 220 in FIG. 2. The method to fabricate the semiconductor device 300 is similar to the method 100 of FIG. 1 except that the capping layer 314 may be formed on the interfacial layer 210, then the high-k dielectric layer 212 may be formed on the capping layer 314, then the metal layer 220 may be formed on the high-k dielectric layer 212, and then continues with the processes discussed in blocks 150-180 of FIG. 1.

The present invention achieves different advantages in various embodiments disclosed herein. For example, the present disclosed method provides a simple and cost-effective method for reducing a threshold voltage in a PMOS device and improving carrier mobility. Accordingly, a semiconductor device having both NMOS and PMOS devices may improve its performance and reliability. Further, the methods and devices disclosed herein may easily be integrated with current CMOS technology processing and semiconductor equipment. For example, the implantation process with a dopant species containing F and the annealing process for implant activation are friendly and compatible with semiconductor processing.

Thus, provided is a method for fabricating a semiconductor device that includes forming a high-k dielectric layer over a semiconductor substrate, forming a capping layer over the high-k dielectric layer, forming a metal layer over the capping layer, forming a semiconductor layer over the metal layer, performing an implantation process on the semiconductor layer, the implantation process using a species including F, and forming a gate structure from the various layers including the high-k dielectric layer, capping layer, metal layer, and semiconductor layer. In some embodiments, the semiconductor layer includes a polysilicon layer. In other embodiments, the species includes F, BF2, BF, or combinations thereof.

In some other embodiments, the implantation process may be performed with an energy ranging from 2 to about 20 KeV and a dose ranging from about 1E14 to about 1E16 atoms/cm2. In still other embodiments, the implantation process includes one of a plasma technique and immersion ion implant technique. In other embodiments, the method further includes after performing the implantation process, performing an annealing process for implant activation by a rapid thermal annealing (RTA), furnace annealing, flash lamp annealing (FLA), laser spike annealing (LSA), or combination thereof. The annealing process includes a temperature ranging from 600 to about 1100 degree C. In some other embodiments, the method further includes forming an interfacial layer between the substrate and high-k dielectric layer.

Also, provided is a semiconductor device that includes a semiconductor substrate and a transistor formed in the substrate, the transistor having a gate stack. The gate stack includes an interfacial layer formed on the substrate, a high-k dielectric layer formed over the interfacial layer, a metal layer formed over the high-dielectric layer, a capping layer formed between the interfacial layer and high-k dielectric layer, or formed between the high-k dielectric layer and the metal layer, and a doped layer formed on the metal layer, the doped layer including at least F. In some embodiments, the doped layer is doped with a dopant including one of F, BF, BF2, and combinations thereof. In other embodiments, the high-k dielectric includes HfO2, HfSiO, HfSiON, HfTaO, HfTaTiO, HfTiO, HfZrO, HfAlON, or combinations thereof. In some other embodiments, the capping layer includes AlOx, AlN, Al with oxidation, or combinations thereof. In other embodiments, the transistor includes a PMOS device. In some embodiments, the doped layer includes a doped polysilicon layer.

Further, provided is a method for fabricating a semiconductor device that includes forming an interfacial layer over a semiconductor substrate, forming a capping layer over the interfacial layer, forming a high-k dielectric layer over the capping layer, forming a metal layer over the high-k dielectric layer, forming a polysilicon layer over the metal layer, performing an implantation process on the polysilicon layer, the implantation process using a dopant including F, and forming a gate structure by patterning the interfacial layer, capping layer, high-k dielectric layer, metal layer, and polysilicon layer. In some embodiments, the dopant includes one of F, BF2, BF, and combinations thereof. In other embodiments, the implantation process may be performed with an energy ranging from 2 to about 20 KeV and a dose ranging from about 1E14 to about 1E16 atoms/cm2. In some other embodiments, the implantation process includes one of a plasma technique and immersion ion implant technique. In still other embodiments, the method further includes the step of after performing the implantation process, performing an annealing process for implant activation by one of a rapid thermal annealing (RTA), furnace annealing, flash lamp annealing (FLA), laser spike annealing (LSA), and combination thereof, where the annealing process includes a temperature ranging from 600 to about 1100 degree C. In yet other embodiments, the step of forming the capping layer and forming the high-k dielectric layer includes one of an ALD, CVD, MOCVD, PVD, and combinations thereof.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, it is understood that the semiconductor devices disclosed herein are not limited to a specific transistor and may include other devices such as a finFET transistor, a high voltage transistor, and a bipolar junction transistor (BJT).

What is claimed is:

1. A semiconductor device comprising a semiconductor substrate and a first transistor formed in the substrate, the first transistor having a first gate stack that includes:
   an interfacial layer formed on the substrate;
   a high-k dielectric layer formed over the interfacial layer;
   a metal layer formed over the high-dielectric layer;
   a capping layer formed between the interfacial layer and high-k dielectric layer; and
   a doped layer formed on the metal layer, the doped layer doped with a species that includes at least F;
   the semiconductor device further including a second transistor with a second gate stack not including an F-doped layer.

2. The semiconductor device of claim 1, wherein the first transistor includes a PMOS device, and wherein the second transistor includes an NMOS device.

3. The semiconductor device of claim 1, wherein the high-k dielectric includes one of HfO2, HfSiO, HfSiON, HfTaO, HfTaTiO, HfTiO, HfZrO, HfAlON, and combinations thereof.

4. The semiconductor device of claim 1, wherein the capping layer includes one of AlOx, AlN, Al with oxidation, and combinations thereof.

5. The semiconductor device of claim 1, wherein the doped layer includes a doped polysilicon layer.

6. The semiconductor device of claim 5, wherein the species includes one of F, BF, BF2, and combinations thereof.

7. The semiconductor device of claim 1, wherein the interfacial layer includes a silicon oxide.

8. A semiconductor device comprising a semiconductor substrate and a first transistor formed in the substrate, the first transistor having a first gate stack that includes:
   an interfacial layer formed on the substrate;
   a high-k dielectric layer formed over the interfacial layer;
   a metal layer formed over the high-dielectric layer;
   a capping layer formed between the high-k dielectric layer and the metal layer; and
   a doped layer formed on the metal layer, the doped layer doped with a species that includes at least F;
   the semiconductor device further including a second transistor with a second gate stack not including an F-doped layer.

9. The semiconductor device of claim 8, wherein the first transistor includes a PMOS device, and wherein the second transistor includes an NMOS device.

10. The semiconductor device of claim 8, wherein the high-k dielectric includes one of HfO2, HfSiO, HfSiON, HfTaO, HfTaTiO, HfTiO, HfZrO, HfAlON, and combinations thereof.

11. The semiconductor device of claim 8, wherein the capping layer includes one of AlOx, AlN, Al with oxidation, and combinations thereof.

12. The semiconductor device of claim 8, wherein the doped layer includes a doped polysilicon layer.

13. The semiconductor device of claim 12, wherein the species includes one of F, BF, BF2, and combinations thereof.

14. The semiconductor device of claim 8, wherein the interfacial layer includes a silicon oxide.

15. A semiconductor device comprising a semiconductor substrate and a first transistor formed in the substrate, the first transistor having a first gate stack that includes:
   a high-k dielectric layer formed over the substrate;
   a metal layer formed over the high-dielectric layer;
   a capping layer formed between the substrate and high-k dielectric layer, or formed between the high-k dielectric layer and the metal layer; and
   a polysilicon layer formed on the metal layer and doped with a species including at least F, in which a flat band voltage of the gate stack is shifted toward a P-work function metal;
   the semiconductor device further including a second transistor with a second gate stack including the polysilicon layer, in which the polysilicon layer in the second gate stack is not doped with F.

16. The semiconductor device of claim 15, wherein the high-k dielectric includes one of HfO2, HfSiO, HfSiON, HfTaO, HfTaTiO, HfTiO, HfZrO, HfAlON, and combinations thereof.

17. The semiconductor device of claim 15, wherein the capping layer includes one of AlOx, AlN, Al with oxidation, and combinations thereof.

18. The semiconductor device of claim 15, wherein the species including at least F comprises at least one of F, BF, BF2.

19. The semiconductor device of claim 15, further comprising an interfacial layer between the substrate and the high-k dielectric layer, the interfacial layer including silicon oxide.

* * * * *